United States Patent
Cattin et al.

(10) Patent No.: US 10,062,927 B2
(45) Date of Patent: Aug. 28, 2018

(54) SYSTEM OF POWER BATTERIES FOR DETERMINING THE IMPEDANCE OF A STAGE

(71) Applicant: Commissariat a l'energie atomique et aux energies alternatives, Paris (FR)

(72) Inventors: Viviane Cattin, Saint Egreve (FR); Rouba Al Nazer, Grenoble (FR); Maxime Montaru, Joursac (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 1164 days.

(21) Appl. No.: 14/258,109

(22) Filed: Apr. 22, 2014

(65) Prior Publication Data
US 2014/0315047 A1    Oct. 23, 2014

(30) Foreign Application Priority Data
Apr. 22, 2013   (FR) ..................... 13 53656

(51) Int. Cl.
*G01N 27/416*   (2006.01)
*H01M 10/42*   (2006.01)
(Continued)

(52) U.S. Cl.
CPC ...... *H01M 10/425* (2013.01); *G01R 31/3662* (2013.01); *H01M 10/482* (2013.01);
(Continued)

(58) Field of Classification Search
USPC ....................................... 324/426
See application file for complete search history.

(56) References Cited

U.S. PATENT DOCUMENTS

2009/0251103 A1* 10/2009 Yamamoto ............... B60K 6/48
                                              320/133
2011/0025271 A1*  2/2011 Yamamoto .......... B60L 11/1864
                                              320/118
2012/0306504 A1  12/2012 Van Lammeren

FOREIGN PATENT DOCUMENTS

JP      2011130550       6/2011
WO   WO2008/046980      4/2008

OTHER PUBLICATIONS

Dong et al., "Dynamic Modeling of Li-Ion Batteries Using an Equivalent Electrical Circuit," Journal of the Electrochemical Society, 158(3): A326-A336 (2011).
(Continued)

*Primary Examiner* — Robert Grant
(74) *Attorney, Agent, or Firm* — Occhiuti & Rohlicek LLP

(57) ABSTRACT

An accumulator battery system has stages, a power connection, a controller, and circuits. The stages are series-connected. Each has an electrochemical accumulator and a switch. A power connection connects a load to the stages. Each the circuit is associated with a stage. Each circuit generates a voltage variation at terminals of its associated stage, and applies, to a switch of the associated stage, a binary sequence at a frequency. The sequence differs from those of other stages, thus allowing distinguishing between stages based on the sequence. The controller, which is connected to the stages by the power connection, measures a voltage variation across terminals of the stage in response to application of the binary sequence to the stage, identifies a stage from which the variation originates by searching for its associate sequence, and determines, from the variation, an impedance of the identified stage for that frequency.

14 Claims, 6 Drawing Sheets

(51) Int. Cl.
*H01M 10/48* (2006.01)
*H02J 7/00* (2006.01)
*G01R 31/36* (2006.01)

(52) U.S. Cl.
CPC .......... *H02J 7/0004* (2013.01); *H02J 7/0013* (2013.01); *H02J 7/0021* (2013.01); *H02J 7/0024* (2013.01); *G01R 31/362* (2013.01); *G01R 31/3658* (2013.01); *H01M 2010/4271* (2013.01); *H01M 2010/4278* (2013.01); *H01M 2220/20* (2013.01); *Y02T 10/7055* (2013.01)

(56) References Cited

OTHER PUBLICATIONS

Fairweather et al. Battery parameter identification with pseudo random binary sequence excitation (PRBS); Journal of Power Sources; 196:9398-9406 (2011).

* cited by examiner

SYSTEM OF POWER BATTERIES FOR DETERMINING THE IMPEDANCE OF A STAGE

RELATED APPLICATIONS

Under 35 USC 119, this application claims the benefit of the priority date of French Patent Application FR1353656 filed on 22 Apr. 2013, the contents of which are herein incorporated by reference.

FIELD OF INVENTION

The invention pertains to batteries of electrochemical power accumulators, and in particular, batteries used in the field of electronic and hybrid transportation or embedded systems.

BACKGROUND

An electrochemical accumulator usually has a nominal voltage that depends on its type.

For NiMH batteries, the nominal voltage is on the order of 1.2 volts. Batteries based on lead technology have a slightly higher nominal voltage, which is on the order of 2 volts. For lithium ion iron phosphate or LiFePO$_4$, the nominal voltage rises to a value on the order of 3.3 volts. In cobalt-oxide-based lithium ion type batteries, the nominal voltage is on the order of 4.2 volts.

These nominal voltages are too low for the requirements of most systems to be powered. To obtain the appropriate level of voltage, several stages are connected in series. To obtain high values of power and capacitance, several accumulators are placed in parallel in each stage. The number of stages (number of groups of accumulators) and the number of parallel-connected accumulators in each stage will vary according to the voltage, the current, and the capacitance desired for the battery. The association of several accumulators is called "a battery of accumulators."

Optimizing the use of the battery requires the most precise possible knowledge of its operating parameters.

Among the operating parameters that may turn out to be important for the management of the battery is the battery's state-of-aging, or stage-of-health. The state-of-health represents losses in the battery's capacitance following execution of a sequence of charging/discharging cycles.

There are several ways to define the state-of-aging or state-of-health (SOH(t)) of a battery at an instant t.

A known definition for the state of health of a battery is the ratio of its capacitance at a particular time, t, to its maximum capacitance ex-works, i.e. its maximum capacitance in the condition in which the battery leaves the factory in which it is made. This ratio is given by:

$$SOH(t)=C(t)/C(t_0)$$

where $t_0$ represents a time between when the battery leaves the factory and when it is first used. The deterioration of the capacitance C(t) over time characterizes the aging of a battery.

Measuring the capacitance C(t) on a battery requires a full charging/discharging cycle. This rarely happens in common use. For example, in a motor vehicle application, normally one would not allow the battery to be fully discharged since one might be stranded on the road when this happens. It is furthermore necessary to obtain the most frequent possible measurement, especially if the battery goes through microcycles, as is often the case in hybrid vehicles. Microcycles do not enable the performance of a full charging/discharging cycle.

Another known definition does not rely on capacitance. This definition relies on the ratio of the minimum resistance of the battery's output at some initial time t0 to the resistance at time t:

$$SOH(t)=R(t0)/R(t)$$

The increase in resistance over time also characterizes the ageing of a battery. Since the determination of the battery's state-of-health has to be fairly precise, the resistance of the battery is most often measured in a laboratory, where a well-defined ambient temperature can be made available. Measuring the resistance can be done with current surges at a frequency generally greater than 1 kHz.

Another method for determining aging requires an electrical model of the battery and battery measurements to to determine the parameters of this electrical model. The quality of this aging measurement relies greatly on the precision of the initially chosen electrical model. In addition, the spectral band of measurement is limited by the complexity of the model. Furthermore, since the identification algorithm is complex, it calls for excessive computations for implementation in embedded applications. For embedded applications, there is an unmet need for determining a battery's state-of-health in order, for example, to adapt the operating parameters of an electric motor to the condition of the battery.

Another operating parameter frequently used in battery management processes is the battery's state-of-energy SoE or state-of-charge SoC. Measuring the state-of-charge is most frequently done on the basis of a coulomb count at the end of the charging cycle. However, this measurement undergoes drift and requires a relatively complex readjustment.

Another frequently used parameter is the power available when charging and discharging. Most frequently, these power values are determined from computation charts as a function of temperature and the battery's state-of-charging. Such a determination can prove to be inappropriate for embedded applications.

Another frequently used operating parameter is open-circuit voltage (OCV). The open-circuit voltage charging or discharging value is a DC potential that varies as a function of the state-of-charge and therefore makes it possible to recalibrate the value of the state-of-charge. The determination of the open-circuit voltage relies on an electrical model of the battery and on the capacity of this model to represent the low-frequency behavior of the battery. The definition of the equivalent electrical model of the battery is based on the determining of the impedance of the battery, and forming a non-linear system. Such a determination is made from laboratory measurements. This method is therefore suited for neither an embedded battery nor for independent analysis of different battery modules.

The management of a battery according to the prior art generally comprises an observation of the electrical variables at the output, i.e. at the terminals of the battery, followed by a diagnosis of the battery's operation operation from these observations. This approach proves to be insufficient because it does not enable the precise determination of which zones of the battery, such as which modules or which groups of cells, are, for example, defective or have their own operating parameters. This results in poor optimization of the battery's operation a rapid decrease in its performance when the battery has a defective or less efficient part. This decrease is often accompanied by a rapid aggravation of its condition and by premature aging.

To improve this general approach, there are certain methods of diagnosis that include observing certain parameters of operation at the level of the modules of the battery. This second approach makes it possible to more specifically observe the particular behavior of certain modules of the battery locally. However, its implementation is complex and requires the use of numerous electrical wires to connect a central diagnostic device to each module. This creates major electrical risks because the wires can heat up. In addition, the wires can be bared by friction, which in turn raises the possibility of short circuits, for example between two stages that are relatively distant from each other and have a high difference in potential. Furthermore, this approach requires intermediate galvanic insulation to protect a central computer, the potential of which is associated with its power supply, which can be very distant from the potentials present in the power battery. Finally, this approach enables only unsatisfactory action on the general operation of the battery.

SUMMARY

The invention seeks to resolve one or more of these drawbacks. It is aimed especially at proposing a solution to reduce electrical risks and to enable the individual and precise management of the operating parameters of a stage in a series connection. The invention thus relates to a system of batteries of accumulators.

The invention applies to a battery comprising several series-connected stages, each stage including at least one electrochemical accumulator. A control device is connected to the stages by an electrical power connection with an electrical charge.

Each stage comprises a respective circuit that is attached to it. This circuit generates a voltage variation at the terminals of the stage by the application of a binary sequence with a first frequency on a switch of the stage. Each binary sequence is different from the binary sequences of the other stages to distinguish the stage from the others.

The control device is programmed to measure the variation of voltage in response to the application of the binary sequence to determine the stage originating the variation and to determine the impedance of the stage identified for the first frequency from the measured voltage variation.

Such a determination of the impedance makes it possible, for example, to have precise knowledge of the parameters of operation of the different stages. Such a determination of impedance also makes it possible to have a same binary sequence to enable the measurement of voltage at the appropriate frequency and to enable the control device to identify the concerned stage. Such transmission limits constraints of galvanic insulation of the system and reduces its cost by reducing the connection cabling needed for the transmission of information. Such transmission is also robust in the face of risks of interference between emissions from different circuits associated with the stages of the battery.

In one aspect, the invention features an apparatus comprising an accumulator battery system. The accumulator battery system has stages, an electrical power connection, a control device, and circuits, each of which is associated with one of the stages.

The stages, each of which has an accumulator and a switch are connected in series. The electrical power connection connects an electrical load to the stages.

Each of the circuits generates a variation in voltage amplitude at terminals of its associated stage, and to apply, to a switch of its associated stage, a binary sequence at a first frequency. The binary sequence is different from binary sequences applied to other stages. As a result, the stages are distinguishable from each other by the binary sequence.

The control device, which is connected to the stages by the electrical power connection, is programmed to measure a voltage variation across terminals of the stage in response to application of the binary sequence to the stage, to identify a stage from which the voltage variation originates by searching for a binary sequence associated with the stage, and to determine, from the voltage variation, an impedance of the identified stage for the first frequency.

In some embodiments, the circuits are configured to apply binary sequences in the form of chirps. In others, they apply square waves. In yet others, they apply pseudo-random binary sequences.

In other embodiments, the control device is configured to operate when the stages power an electrical load connected to the electrical power connection.

In some embodiments, each of the circuits is configured to measure a voltage across terminals of an associated stage during application of the binary sequence. Each of the circuits is configured to determine an impedance value of the stage from the measured voltage, and to send the impedance value to the control device by carrier current. The control device is configured to compare the impedance value determined by the control device with a corresponding impedance value sent by a circuit.

Among these are embodiments in which the circuit is configured to distinguish between two binary sequences by sending a binary sequence at a second frequency, the binary sequence at a second frequency being sent via carrier current, in response to voltage variation of an associated stage, by application the switch. The binary sequence at the second frequency has a header to distinguish the stage. The header is identical to a header of the binary sequence at the first frequency.

In other embodiments, each of the circuits is configured to generate a variation in amplitude of voltage at terminals of an associated stage by application, to a switch of the stage, of a binary sequence at a third frequency, each binary sequence being different from binary sequences of other, whereby stages can be distinguished from each other based on the binary sequences, and wherein the control device is further programmed to measure a voltage variation at terminals of the stage in response to application of the binary sequence at the third frequency to the stage, to identify a stage originating the voltage variation by searching for a binary sequence associated with the stage, to determine an impedance of the stage identified for the third frequency, from the voltage variation, and to extrapolate a model of a transfer function of the stage as a function of impedance values determined for the first and third frequencies.

Also included are embodiments in which the control device is further configured to extrapolate a parameter of operation of the stage as a function of the determined impedance value and the first frequency.

In other embodiments, the first frequency is between 0.1 mHz to 10 Hz, and the control device is further configured to extrapolate a stage-of-charge of the stage as a function of the determined impedance value.

In additional embodiments, the first frequency is between 10 Hz to 5 KHz and the control device is further configured to extrapolate a state-of-aging of the sending stage as a function of the determined impedance value.

In yet other embodiments, the first frequency is greater than 5 KHz, and the control device extrapolates the stage's state-of-connection as a function of the determined impedance value.

Among other embodiments are those in which a voltage across terminals of the electrical power connection is greater than 50 volts.

In some embodiments, each of the circuits is electrically powered by the associated stage.

Also among the embodiments are those in which each of the circuits induces variations in voltage amplitude by connecting an electrical load across terminals of a stage corresponding to the circuit.

Embodiments further include those in which each stage comprises parallel-connected arms, each of which comprises an electrochemical accumulator and a switch, wherein the electrochemical accumulator and the switch are connected in series, wherein one of the circuits is configured to apply the binary sequence at the first frequency to the switch.

BRIEF DESCRIPTION OF THE FIGURES

Other features and advantages of the invention shall appear clearly from the following description, given by way of a non-exhaustive indication, made with reference to the appended drawings, of which.

DETAILED DESCRIPTION

Figure 1:
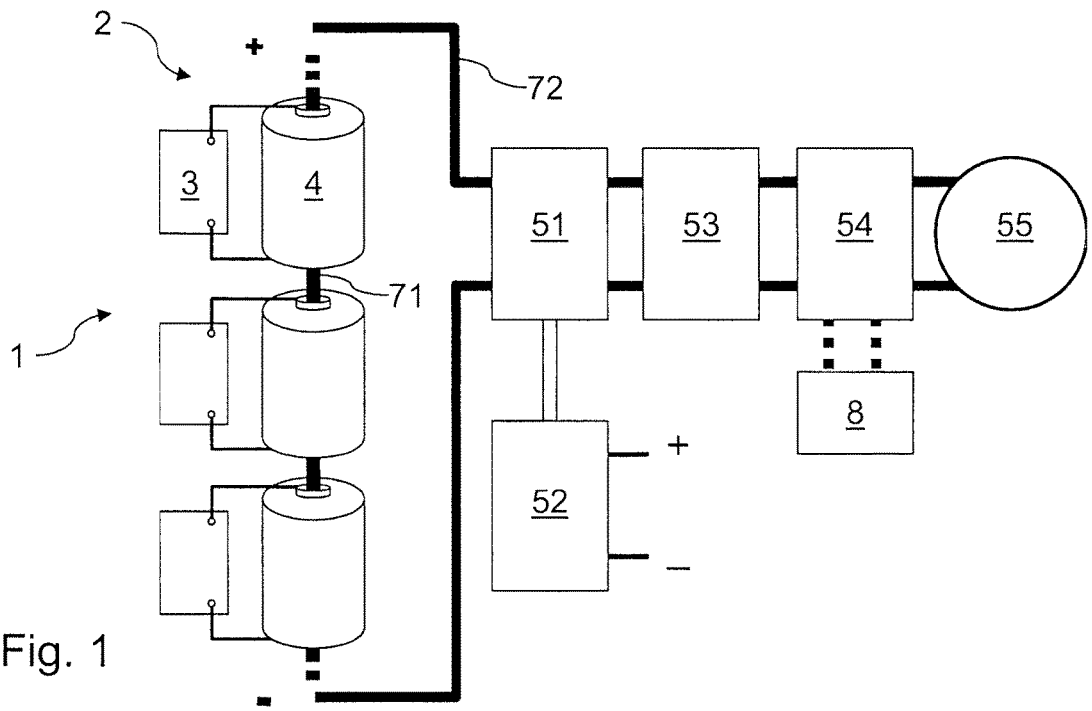
FIG. 1 is a schematic representation of a system of batteries of accumulators in which a first embodiment of the invention is implemented.

FIG. 1 illustrates accumulator battery system 1 according to a first embodiment of the invention implemented to ensure the driving of an electric motor 55. The battery system 1 comprises a battery 2 including series-connected electrochemical accumulators 4. The battery 2 comprises a large number of accumulators 4. Depending on the voltage needed and the type of accumulators used, there may twenty to one hundred accumulators. The voltage at the terminals of the battery is typically greater than fifty volts.

The accumulators 4 are series-connected by electric power connections 71. Each accumulator 4 can be replaced by an electrical energy stage including several electrochemical accumulators, such as a module that includes electrochemical accumulators that are series-connected and/or parallel-connected in a common pack.

Electrical power connections 72 connect the battery 2 to a filtering module 51. An electromagnetic anti-parasite filter 53, or "EMC filter," is also connected to the battery 2 by the electric power connections 72. The anti-parasite filter 53 is connected between the filtering module 51 and an AC/DC converter 54. The AC/DC converter 54 is also connected to the electric connections 72 and forms the interface between the battery 2 and the components working under alternating current, in this case an electric motor 55 and a recharging alternating current source 8.

The anti-parasite filter 53 eliminates the electromagnetic disturbances in the DC network during the working of the motor 55. In particular, the anti-parasite filter 53 filters out the high-order harmonics that can be induced by the power switch-over circuits for the high charging or discharging currents.

A centralized control device, in this case formed by a computer 52, is connected to the filtering module 51 to retrieve a low-voltage signal. Because of the anti-parasite filter 53 between the converter 54 and the filtering module 51, any information transmitted from an accumulator remains undisturbed by the harmonics related to the chopping carried out in the converter 54 or in the control unit of the motor 55. The filtering module 51 can be used to demodulate the information given from the accumulators 4.

In the illustrated embodiment, each accumulator 4 has a circuit 3 that is attached to it. A circuit 3 is typically fixed, for example, to an associated accumulator 4 and preferably powered by that accumulator 4. Each circuit 3 generates a voltage variation at the terminals of its associated accumulator 4 by application of a binary sequence at a first frequency to a switch. For each stage, the binary sequence of that stage is different from the binary sequences of other stages. This enables one stage to be distinguished from the other stages.

Figure 2:
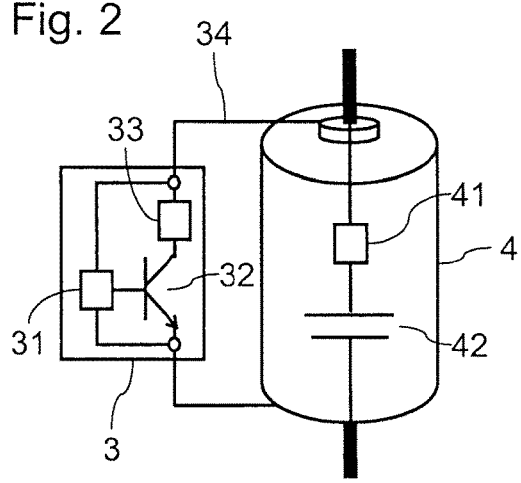
FIG. 2 is an equivalent electrical diagram of a circuit associated with a stage.

FIG. 2 represents an equivalent electrical diagram of a circuit 3 and its associated accumulator 4. The circuit 3 comprises an arm. The arm comprises a power transistor 32 and a discharging resistor 33 in series. This arm is connected in parallel to the terminals of the accumulator 4 by a cable 34. The circuit 34 also comprises a microcontroller 31 connected to the terminals of the accumulator 4.

The microcontroller 31 is configured to turn on the transistor 32 with different calibrated frequencies and according to predefined binary sequences. The conductive transistor 32 brings about a drift, for example, in a current of calibrated amplitude dik for the nominal voltage of its accumulator 4 during its conduction phases. During its conduction phases, the transistor 32 thus induces a voltage variation at the terminals of its accumulator 4. This embodiment provides excellent control of the voltage and frequency variation of the binary sequence. It is then not necessary to measure the amplitude variation in the current dik. It is enough to know the relationship between the actions of the microcontroller 31 and the value of the discharging resistance 33. This can be known, for example through a preliminary calibration during the manufacture of the circuit 3. The value of dik is then stored in the microcontroller 31.

When a voltage variation at the terminal of an accumulator 4 is achieved by a binary sequence at a given frequency, the computer 52 measures, at the accumulator's terminals, the voltage variation of the accumulator in response to the application of this binary sequence to the transistor 32 associated with this accumulator 4. The computer 52 then identifies the accumulator 4 that has originated the voltage variation by searching for the binary sequence associated with this accumulator. From the measured voltage variation, the computer 52 then determines the impedance of the identified accumulator 4 for the frequency of the binary sequence.

The measurement of the voltage variation of an accumulator 4 is advantageously done when the battery 2 powers an electrical load connected to the terminals of the electrical power connection.

The computer 52 can extrapolate different operating parameters of the battery 2 from a measurement of the impedance of its accumulators 4 and from knowing the frequency for which this impedance has been determined.

The computer 52 can compute the state-of-charge of an accumulator 4. The state-of-charge of the accumulator is computed, for example, from its impedance following a binary sequence at a maximum frequency at least equal to 1 Hz, preferably at least equal to 10 Hz, advantageously below 50 Hz and preferably below 20 Hz.

The computer 52 can compute the state-of-health of an accumulator. The state-of-health of an accumulator is computed, for example, from its impedance following a binary sequence at a frequency at least equal to 10 Hz, preferably at least equal to 100 Hz, and preferably below 5 kHz. The state-of-health, SOH, of an accumulator can be estimated, for example, by determining its resistance (Joule resistance) from the model detailed below. It is possible for example to compare a value of resistance ex-works with a determined value of resistance to deduce the state-of-health therefrom.

The computer 52 can also identify a connection defect of an accumulator. The identification of a connection defect of an accumulator can be done, for example, from its impedance following a binary sequence at a frequency greater than 5 kHz. The quality of the connection system of an accumulator can be determined, for example, by determining its inductance from the model detailed below. It is possible, for example, to compare an einductance value ex-works with a determined inductance value to estimate the state-of-connection of the system.

The computer 52 can also determine the end of a discharge of the battery 2 in determining the frequency of transition of the battery 2 from its impedance. A method for computing the transition frequency based on a measurement of impedance is described in further detail in the patent application PCT/FR2007/001635.

The computer 52 can compute the power of the battery 2. This computation can be done from the computation of the power values of the different accumulators 4. The power of an accumulator 4 can be computed from a measurement of the state-of-charge of that accumulator 4 combined with a measurement of the temperature of the battery or of that accumulator 4. The power of an accumulator 4 can also be determined from the open-circuit voltage.

The computer 52 can compute the open-circuit voltage. This measurement can then be used to compute a state-of-charge.

Figure 3:
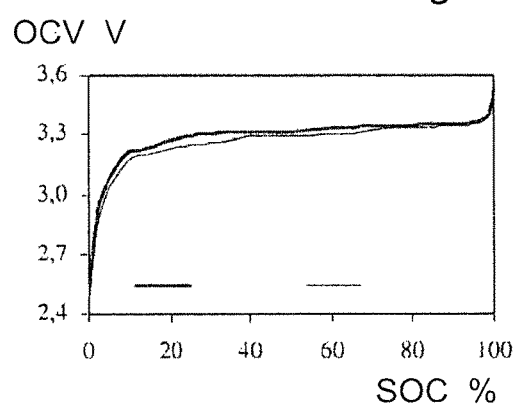
FIG. 3 represents a law of variation of an open circuit voltage of an example of an accumulator as a function of its state of charge.

FIG. 3 illustrates an example of an open circuit voltage of a lithium-ion $LiFePO_4$ type accumulator. The graph shows the open circuit voltage on the vertical axis according to the percent state-of-charge on the horizontal axis. The bold-line curve corresponds to an accumulator being charged, and the fine-line curve corresponds to an accumulator being discharged. This curve has the advantage of being relatively independent of the temperature.

Figure 4:
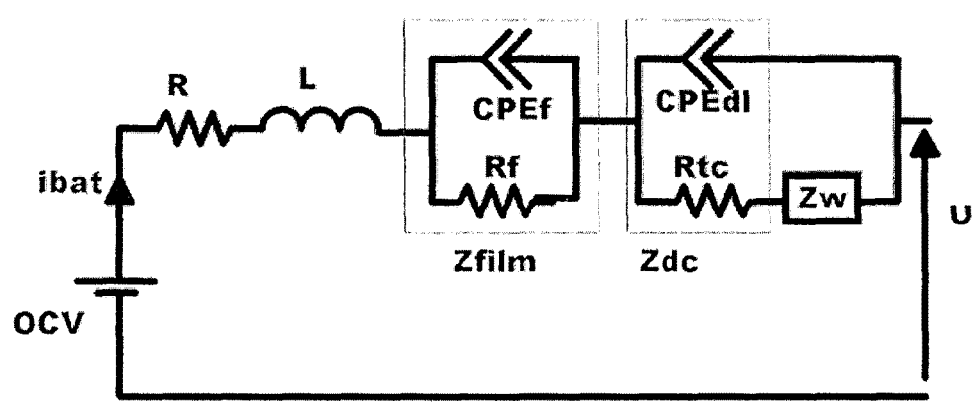
FIG. 4 is an example of an equivalent electric model for a lithium-ion accumulator.

The computer 52 can also set up or update an equivalent electrical model of the battery 2. The model illustrated in FIG. 4 can, for example, be used. This model is for example described in M. Dong, "Dynamic modeling of Li-ion batteries using an equivalent electrical circuit," in Journal of the Electrochemical Society. This model is aimed at taking account of the connectors, the electronics, the passivation film, and the transfer of charges. The left-hand part of the model characterizes the high-frequency behavior of a battery, and the right-hand part of the model characterizes its low-frequency behavior. This model therefore shows the open-circuit voltage, the resistance R of the battery and its inductance L. The components CPEf and CPEdl included in the Zfilm and Zdc elements respectively are constant phase elements (CPEs) that represent the behavior of the battery observed following measurements of impedance by spectroscopy. A CPE is a component that has a partially capacitive and a partially resistive behavior. The CPE is defined by the parameters T and p (with p ranging from 0 to 1) complying with the following equation to determine its impedance:

$$Zcpe(f)=1/(T*(j*2\pi f)p)$$

The model of a battery can be established by measuring its impedance for different frequencies of binary sequences. The circuit 3 can thus be programmed to selectively apply the binary sequence to different frequencies.

Figure 5:
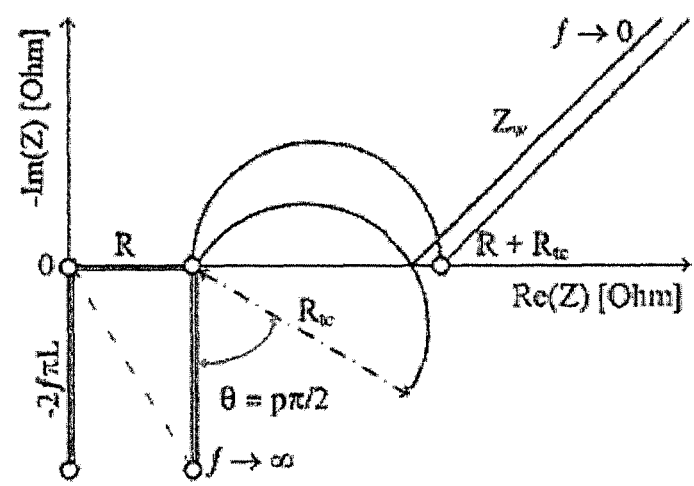
FIG. 5 is a schematic Nyquist diagram representing a modeling of a transfer function of an accumulator.
Figure 6:
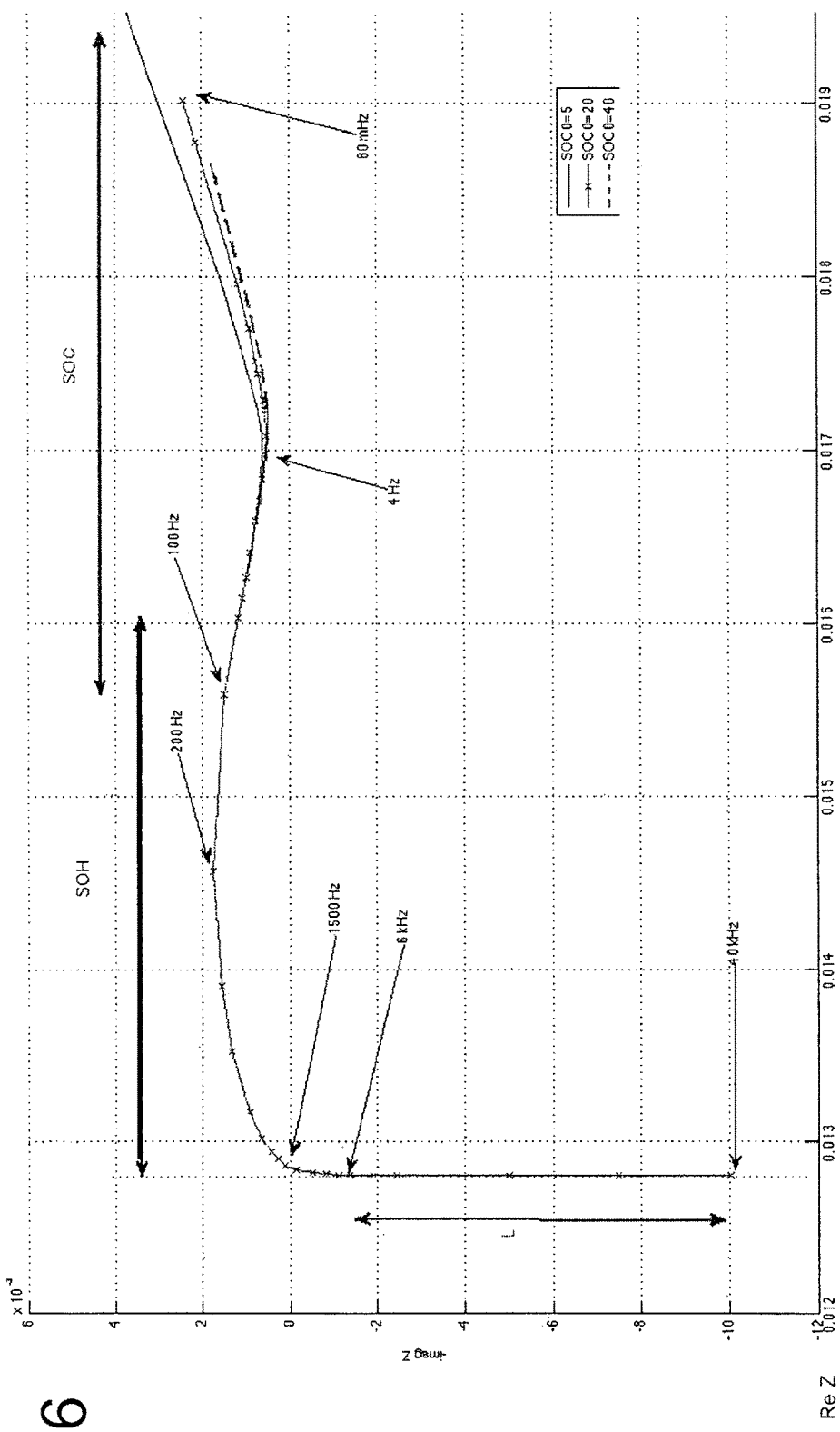
FIG. 6 is a Nyquist diagram plotted for an example of an accumulator as a function of its state of charge.

FIG. 5 is a schematic Nyquist diagram or plot of the impedance representing a transfer function of an accumulator according to such a model. FIG. 6 is a Nyquist diagram plotted following measurements for an accumulator for different charge states. At high frequencies, beyond 6 kHz, the inductive part of the accumulator becomes preponderant. This corresponds to the rising edge of the curve. The position of this rising edge is used to determine the resistance R of the accumulator. At mean frequency, between 4 Hz and 6 kHz, the shape of the curve is defined chiefly by the value of the resistor R and the capacitance. At low frequency, below 4 Hz, the state of charge of the accumulator is seen to have a high incidence on the shape of the curve.

The computer 52 can furthermore fulfill different functions according to parameters of operation extrapolated from the measurements of impedance. For example, the computer 52 can estimate the stability of the system 1 in ascertaining that the successive measurements of the state of charge of the battery 2 do not show any excessive difference.

The operating parameters determined by the computer 52 using measurements of impedance of the accumulators 4 can be used by the computer 52 to modify the use of the battery 2. The computer 52 can thus modify the use of the battery 2 according to the temperature, the bias current, or a mode of charging or discharging.

The binary sequences can, for example, be applied in the form of chirps, square waves, or pseudo-random binary sequences.

The encoding of the binary sequences that makes it possible to distinguish the different accumulators at the computer 52 can be based on a spread code using a pseudo-random binary sequence. A pseudo-random binary sequence is a series of bits (0 or 1) that is random in appearance but is in reality periodic. A transmitted sequence is called a "symbol." The set of possible symbols complying with the same properties is called a "code".

Two characteristics of these sequences are advantageous.

First, the self-correlation of each symbol is high. A high value of self-correlation is used to identify one transmitted symbol among several symbols received by a demodulator.

Second, the intercorrelation between symbols is low. A low value of intercorrelation prevents interference between symbols. A demodulator can then reliably identify them univocally even if they have been received simultaneously.

The Kasami code, for example, has very good properties of self-correlation and inter-correlation. To verify these properties, tests were made especially with a 63-bit Kasami code that makes it possible to have 16 different symbols.

The microcontroller 31 is furthermore advantageously configured to measure the voltage at the terminals of the accumulator 4 during the binary sequences at a given frequency. The microcontroller 31 is then furthermore configured to determine the impedance of the accumulator 4 at the given frequency as a function of the measured voltage and the variation in amplitude dik.

Thus, the accumulator 4 is crossed by a current I when the transistor 32 is non-conductive and crossed by a current (I-dik) when the transistor 32 is conductive.

Z designates the impedance of the battery 2 and U designates the voltage at its terminals. Zk designates the impedance of the accumulator 4 associated with the circuit 3 and Uk designates the voltage at the terminals of this accumulator 4.

Outside a conduction of the transistor 32, $U=Z*I$ and $Uk=Zk*I$. During a conduction of current dik through the transistor 32, the voltage U is defined by $U=Z*I-Zk*dik$. During the conduction, the voltage Uk is defined by $Uk=Zk*I-Zk*dik$. The impedance Zk at the frequency of the binary sequence can thus easily be deduced from a measurement of voltage Uk by the microcontroller 31.

The microcontroller 31 is then advantageously capable of communicating the value of the impedance Zk, which it determines, to the computer 52 by carrier current. The microcontroller 31 communicates with the computer 52 by carrier current using the electrical power connections 71 and 72.

Thus, for a same frequency of a binary sequence, the computer 52 and the microcontroller 31 can determine the value of the impedance Zk of the accumulator 4 at this frequency. For a given frequency of a binary sequence, the computer 52 can then compare the value of the impedance that it has itself determined with the value of impedance determined by the microcontroller 31. The computer 52 can then determine a level of reliability of a measurement of impedance obtained.

The microcontroller 31 advantageously transmits the impedance value that it determines by carrier current using a binary sequence at a frequency (for example 80 kHz) that is different from the one used for the measurement of impedance. Thus, the circuit 3 is used both to measure impedance and to transmit this measurement of impedance to the computer 52.

The activation of the binary sequence for the measurements of impedance can either be managed autonomously by a circuit 3, or can be commanded by the computer 52. The measurement of impedance by a given circuit 3 or by the computer 52 can be activated by different events. For example, the computer 52 can detect the end of the charging of the battery 2 and control the circuit 3 to generate a binary sequence at a given frequency in order, for example, to compute the state-of-health of the battery. The computer 52 can also detect the stopping of the motor 55 and decide on a measurement of impedance of an accumulator 4 at a given frequency, in order to compute the state of charge of the battery 2. The measurement of impedance at a given frequency can also be controlled by a time-out integrated into the circuit 3 or into the computer 52.

In addition to the determined value of impedance, the microcontroller 31 can also be configured to transmit the frequency for which this impedance has been determined, especially if the measurement of impedance has not been commanded by the computer 52.

The microcontroller 31 can also be configured to measure other operational parameters of the accumulator 4, for example its temperature.

The bias current I passing through the accumulator 4 must have a low variation frequency relative to the frequency of voltage variations. Thus, the contribution of the bias current I to the voltage of the accumulator 4 can easily be filtered by means of a high-pass filter. The bias current, for example, does not induce a variation of more than 2% of the charge state during performance of the binary sequence. The bias current I can be a discharging current through the electrical load, which in the illustrated embodiment would be the motor 55, or a charging current given by the source 8.

Figure 7:
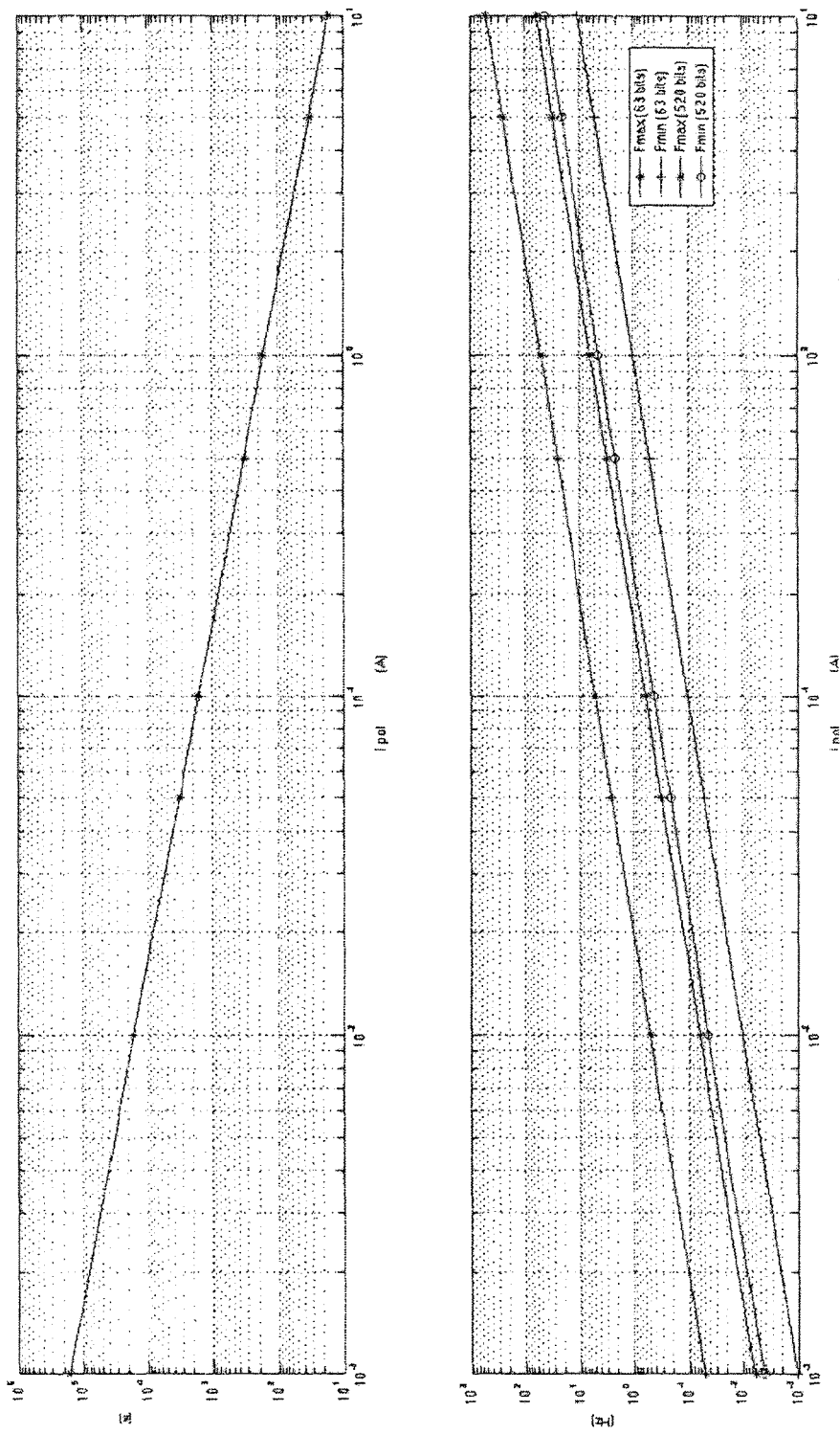
FIG. 7 provides graphs used to deduce a maximum duration of variation and a spectral band of variation available as a function of a bias current.

The amplitude of a variation in current dik has to be fixed according to the order of magnitude of the bias current I in order to ensure the stability and linearity of the battery 2. A compromise between the amplitude dik, its duration and the bias current I is advantageously maintained so that the variation of amplitude dik does not discharge the battery 2. Typically, $dik<0.01*I$. The duration of a variation dik depends on the signal-to-noise ratio of the measurement of the voltage Uk. A noisy measurement requires high averaging, hence a repetition of a binary sequence. The graphs of FIG. 7 are used firstly to determine the maximum possible duration of a binary sequence as a function of the bias current in an accumulator 4 and secondly to determine the spectral band that can be used to carry out the binary sequence as a function of the bias current. The top curve thus determines the maximum duration of a binary sequence for a state-of-charge that diminishes by no more than 2%.

According to a simplified model, the accumulator 4 is likened to a DC voltage source 42 series-connected with an internal impedance 41, the order of magnitude of which is 1 m$\Omega$. The arm of the circuit 3 includes the power transistor 32 and the discharging resistor 33, which is advantageously sized so that the current passing through this arm is not negligible relative to the charging or discharging current of the battery 2. It is possible for example to size the resistor 33 in such a way that the closing of the power transistor 32 induces a drop in the voltage of the accumulator 4 on the order of 0.1% or even 1% during communication from the circuit 3 to the computer 52. A sudden drop in voltage on the order of 0.1% at the terminals of the accumulator 4 can easily be detected since the voltage at the terminals of the accumulator 4 normally undergoes relatively slow variations. The resistor 33 could, for example, have a value of resistance on the order of 3$\Omega$. Thus, if the accumulator is crossed by a current of 100 A, the resistor 33 is crossed by a current of 1 A during the closing of the transistor 32. In order to limit the consumption of current in the circuit 3, the discharge resistor 33 has a value at least 50 times greater than the internal impedance of the accumulator 4 at the frequency of a binary sequence.

Although the circuit 3 has been described on the basis of a diagram including a resistor 33 and a power transistor 32 connected in series, this circuit 3 can be made by any appropriate means, for example by using a power transistor having a conduction resistance that enables the generation of a drop in voltage of the required order of magnitude in the accumulator 4.

The computer 52 can identify a circuit 3 by a correlation with pre-recorded sequences. A circuit 3 can also be identified by a demodulator of the computer 52.

Figure 8:
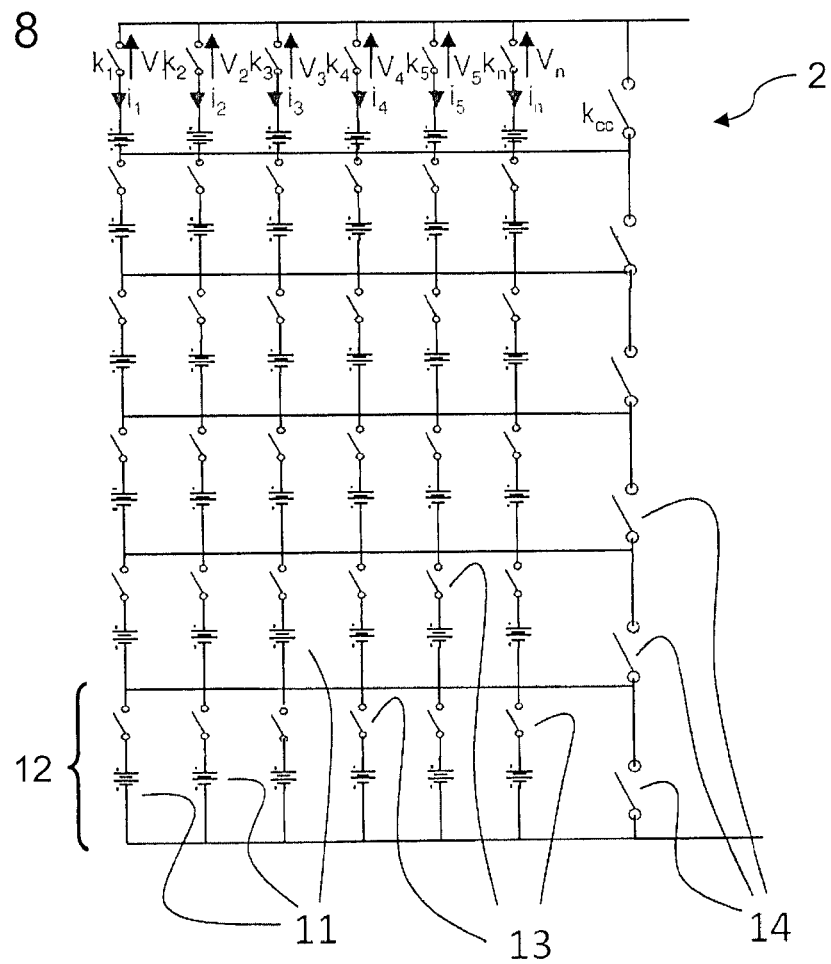
FIG. 8 is a schematic representation of a system of batteries of accumulators in which a second embodiment of the invention is implemented.

FIG. 8 illustrates a battery 2 of a first variant of a second embodiment of the invention. In this embodiment, electrochemical cells 11 are connected in parallel in several stages or electric modules 12. The stages 12 are series-connected.

Each cell 11 is associated with a switch 13 (here below designated as a cell switch 13) that is proper to it and is series-connected. This switch 13 enables its associated cell to be disconnected from the rest of the battery by being opened. In addition, each stage 12 also has a switch 14 (here below designated as a stage switch 14) parallel-connected with the cells 11 of the stage 12, thus enabling the entire stage to be short-circuited.

Figure 9:
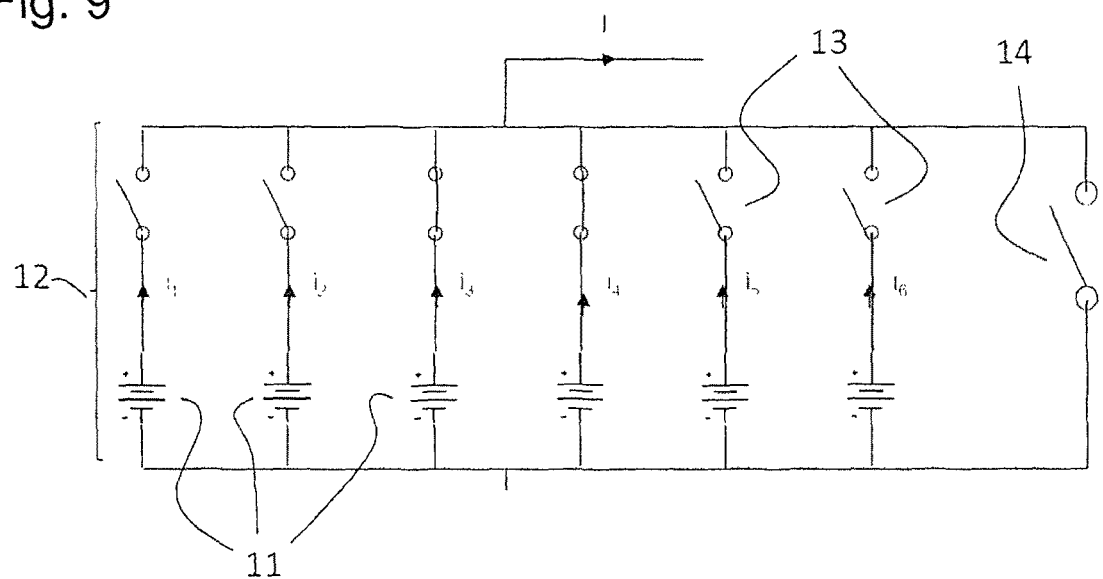
FIG. 9 is a stage of the battery illustrated in FIG. 8.

FIG. 9 provides a more detailed illustration of a stage 12 of the battery 2. The stage 12 comprises a lower terminal connected to a lower neighboring stage and an upper terminal for a serial link with the upper neighboring stage. According to this example, this stage 12 comprises six cells 11 placed in parallel. More specifically, this stage comprises six parallel arms positioned between its upper and lower terminals, on which there is a cell 11, and a cell switch 13 capable of disconnecting or not disconnecting a cell from one of the two terminals. The stage 12 has a seventh arm on which there is positioned a stage switch 14 in parallel with the cells 11 capable of shunting the cells 11. In the illustrated example, only the third and fourth cells are used because their respective cell switches 13 are closed, whereas all the other cell switches are open. Furthermore, the stage switch 14 is open to place the stage 12 in its normal energy storage or energy-rendering configuration.

The different switches 13, 14 are preferably set up by means of power transistors, for example NMOS type transistors that provide a gain in conductivity in their "on" state. PMOS transistors can be used as a variant. As a variant it is also possible to use other types of transistors such as bi-polar transistors, FETs, JFETs, IGBTs, etc.

In operation, when the device is in its usual operating configuration, at least one of the cell transistors 13 is closed while the stage transistor 14 is open, thus enabling the cells 11 associated with the closed cell transistors 13 to deliver a voltage and a current that pass through the closed transistors and that will finally contribute to the supply of the load connected to the terminals of the battery 2.

When all the switches 13 are closed and when the switch 14 is open, each accumulator 11 undergoes a flow of current, the value of which depends on the bias current, I, of the battery 2 and the number of accumulators 11 in the stage 12.

By applying a binary sequence at a given frequency to the transistor 13 of the first arm, for example, the current undergone by its series-connected accumulator 11 can be made to vary between 0 and i1. The other arms of the stage 12 also perceive a variable current and a variable voltage owing to the driving dictated on the first arm. The current in these other arms ranges from ik to ik+i1/(k−1). By repeating this binary sequence for the different transistors 13 of the stage, the computer 15 can determine the impedance of this stage at the given frequency.

The opening and/or closing of the switches 13 and 14 can be controlled by an electronic board of the stage 12 according to binary sequences at predefined calibrated frequencies.

This electronic board can carry out measurements of voltage at the terminals of the different accumulators 11 in order to transmit an impedance value from the stage 12 to the computer 52. This impedance value can thus be compared with the impedance value determined by the computer 52.

A second variant of the second embodiment repeats the structure of the first variant and the stage switch 14 is eliminated in each of the stages.

The working of this device can be as follows. When it is used in the usual operating configuration, at least one, and generally all, the cell transistors 13 are closed while the stage transistor 14 is open. This enables the cells 11 associated with the closed cell transistors 13 to deliver a voltage and a current that pass through the closed transistors and that will finally contribute to the supply of the charge connected to the terminals of the battery 2.

When all the switches 13 are closed and the switch 14 is open, each accumulator 11 has a current flowing in it. The value of this current depends on the bias current, I, of the battery 2, and the number of accumulators 11 in the stage 12.

In the mode of determining the impedance of the stage 12, there is an alternation between a first state, in which all the switches 13 of the stage 12 are closed, and a second stage, in which only one of the switches 13 of the stage 12 is closed. This alternation is obtained according to a binary sequence at a given frequency. The switch 13, which remains closed in this embodiment, corresponds to the cell 11 for which it is desired to measure the impedance $Zm$.

In the first state, the relationship $U=Zm*Im$ is verified with $Im$ being the intensity passing through the cell 11 for which the impedance $Zm$ is to be measured. With impedance values that are proximate for the different cells, the relationship can be approximated by $U=Zm*I/n$, with n being the number of parallel-connected cells in the stage 12 and I being the bias current of the battery 2. In the second state, $U=Zm*I$.

Between the two states, the cell 11 for which the impedance $Zm$ is to be measured is crossed alternately by a current $I$ and a current $I/n$.

To guarantee the reliability of the measurement, it is desirable that the system remain linear and invariant, i.e that the system be an LTI system, during the second mode of operation. The variation $dImax$ between these two states must then verify the following relationship $dImax>I-I/n$, that is $I<dImax*n/(n-1)$ with a value of $dImax$ of some hundreds of mA, depending on the state of charging of the battery, the time of measurement and the bias current. Consequently, the mode for determining impedance should advantageously be used when the battery 2 gives a fairly small bias current.

By repeating the mode of determining impedance for the different transistors 13 of the stage, the computer 52 could determine the impedance of this stage 12 at the given frequency.

The current can be measured in each arm or can be determined by a fairly precise preliminary knowledge of the impedance values of the different arms, by an initial calibration and a subsequent tracking.

The opening and/or closing of the switches 13 can be controlled by an electronic board of the stage 12 according to binary sequences at predefined calibrated frequencies. This electronic board can transmit an impedance value from the stage 12 to the computer 52. This impedance value can thus be compared with the impedance value determined by the computer 52.

Having described the invention, and a preferred embodiment thereof, what is claimed as new, and secured by Letters Patent is:

1. An apparatus comprising an accumulator battery system, said accumulator battery system comprising series-connected stages, each comprising means for providing electrochemical energy and means for selectively interrupting current, means for connecting an electrical load to said stages, and a control device, wherein each of said stages is associated with means for generating an amplitude voltage variation at terminals of said associated stage, wherein said means for generating an amplitude voltage variation at terminals of said associated stage comprises means for application of a binary sequence to said means for selectively interrupting current of said associated stage, said binary sequence has a first frequency, said binary sequence differing from binary sequences associated with other stages thereby enabling stages to be differentiated from each other by binary sequences applied thereto, wherein said control device is connected to said stages by said means for connecting an electrical load to said stages, wherein said control device is programmed to measure a voltage variation across terminals of said stage in response to application of said binary sequence to said stage by said means for application of a binary sequence to said means for selectively interrupting current of said associated stage, wherein said control device is programmed to identify a stage from which said voltage variation originates by searching for a binary sequence associated with said stage, and wherein said control device is configured to determine, from said voltage variation, an electrical parameter of said identified stage for said first frequency.

2. The apparatus of claim 1, wherein said means for generating an amplitude voltage variation is configured to apply binary sequences in the form of chirps, square waves, or pseudo-random binary sequences.

3. The apparatus of claim 1, wherein said control device is configured to operate when said series-connected stages power said electrical load.

4. The apparatus of claim 1, wherein said means for generating an amplitude voltage variation is configured to measure a voltage across terminals of an associated stage during application of said binary sequence, to determine an impedance value of said stage from said measured voltage, and to send said impedance value to said control device by carrier current, and wherein said control device is configured to compare said impedance value with a corresponding impedance value sent by a means for generating an amplitude voltage variation.

5. The apparatus of claim 4, wherein said means for generating an amplitude voltage variation is configured to distinguish between two binary sequences by sending a binary sequence at a second frequency, wherein said binary sequence at said second frequency is sent via carrier current in response to voltage variation of an associated stage by application of said means for selectively interrupting current, wherein said binary sequence at said second frequency has a header to distinguish said stage, and wherein said header is identical to a header of said binary sequence at said first frequency.

6. The apparatus of claim 5, wherein each of the means for generating an amplitude voltage variation is configured to generate a variation in amplitude of voltage at terminals of an associated stage by application, to a means for selectively interrupting current of said stage, of a binary sequence at a third frequency, wherein each binary sequence is different from binary sequences of other stages, whereby stages can be distinguished from each other based on said binary sequences, and wherein said control device is further programmed to measure a voltage variation at terminals of said stage in response to application of said binary sequence at said third frequency to said stage, to identify a stage originating said voltage variation by searching for a binary sequence associated with said stage, to determine an impedance of said stage identified for said third frequency, from said voltage variation, and to extrapolate a model of a transfer function of said stage as a function of impedance values determined for said first and third frequencies.

7. The apparatus of claim 1, wherein said control device is further configured to extrapolate a parameter of operation of said stage as a function of said determined value of impedance and said first frequency.

8. The apparatus of claim 1, wherein said first frequency is between 0.1 mHz to 10 Hz, and wherein the control device is further configured to extrapolate a stage-of-charge of said stage as a function of said determined value of impedance.

9. The apparatus of claim 1, wherein said first frequency is from 10 Hz to 5 KHz and wherein the control device is further configured to extrapolate a state-of-aging of said sending stage as a function of said determined value of impedance.

10. The apparatus of claim 1, wherein said first frequency is greater than 5 KHz, and wherein said control device extrapolates a state-of-connection of said stage as a function of said determined value of impedance.

11. The apparatus of claim 1, wherein a voltage across terminals of said electrical power connection is greater than 50 volts.

12. The apparatus of claim 1, wherein said means for generating an amplitude voltage variation of a stage is electrically powered by said stage.

13. The apparatus of claim 1, wherein each of said stages is associated with a means for generating an amplitude voltage variation that induces said variations in voltage amplitude by connecting an electrical load across terminals of a stage corresponding to said circuit.

14. The apparatus of claim 1, wherein each stages comprises parallel-connected arms, each of which comprises an electrochemical accumulator and a switch, wherein said electrochemical accumulator and said switch are connected in series, wherein one of said circuits is configured to apply said binary sequence at said first frequency to said switch.

* * * * *